United States Patent [19]

Bradinal

[11] Patent Number: 4,859,883
[45] Date of Patent: Aug. 22, 1989

[54] DIGITAL CIRCUIT ARRANGEMENT FOR QUANTIZATION-NOISE REDUCTION

[75] Inventor: Werner H. W. Bradinal, Hamburg, Fed. Rep. of Germany

[73] Assignee: U.S. Philips Corporation, New York, N.Y.

[21] Appl. No.: 130,367

[22] Filed: Dec. 8, 1987

[30] Foreign Application Priority Data

Dec. 10, 1986 [DE] Fed. Rep. of Germany ....... 3642168

[51] Int. Cl.$^4$ .......................... H03K 5/00; H03K 5/08; H03B 19/00; H03B 1/00
[52] U.S. Cl. .................... 307/546; 307/553; 307/555; 307/556; 307/558; 307/529; 328/14; 328/162; 328/165; 328/167
[58] Field of Search ............... 307/542, 543, 546, 553, 307/555, 556, 558, 529; 328/14, 162, 165, 167

[56] References Cited

FOREIGN PATENT DOCUMENTS 3021012 12/1981 Fed. Rep. of Germany .

OTHER PUBLICATIONS

Dick Goedhart, "14 Statt 16 Bit D/A-Umsetzer für den Audiobereich", Elektronik 14, 15/7/1983, pp. 61-64.

Primary Examiner—Stanley D. Miller
Assistant Examiner—Trong Quang Phan
Attorney, Agent, or Firm—Thomas A. Briody; Jack E. Haken; Jack D. Slobod

[57] ABSTRACT

The invention relates to a digital circuit arrangement which comprises an interpolation filter which over samples a digital input signal, a noise shaper (1) following the interpolation filter (1), and a digital-to-analog converter coupled to the output of the noise shaper. The noise shaper includes a quantizer whose output signal is the output signal of the noise shaper. A quantization-error signal is formed which is passed through a limiter, filtered and added to the output signal of the interpolation filter to provide correction.

12 Claims, 2 Drawing Sheets

DIGITAL CIRCUIT ARRANGEMENT FOR QUANTIZATION-NOISE REDUCTION

BACKGROUND OF THE INVENTION

1. Field of the Invention

The invention relates to a digital circuit including an interpolation filter for over-sampling a digital input signal in the form of a temporal sequence of samples and a noise shaper having a quantizer responsive both to the output of the interpolation filter and to feedback due to its own output.

2. Description of the Prior Art

Such a digital circuit arrangement is known from DE-PS 30 31 012. In this known arrangement the samples of the digital input signal, which have a specific sampling rate, are applied to an interpolation filter comprising a register. The output of the register is connected to a noise shaper, comprising a quantizer, two adder stages and one filter. The output signal of the filter is subtracted from the output signal of the register in the first adder stage. The output signal of the first adder stage is applied to the quantizer, which is a linear quantizer. In a linear quantizer the quantization steps and the intervals between the individual quantization steps are of equal magnitude. The second adder stage forms the quantization-error signal between the output signals of the quantizer and of the first adder stage is formed and supplies it to the filter arrangement. The frequency with which the samples of the quantization-error signal are applied to the filter arrangement is higher than the frequency with which the samples of the input signal are loaded into the register. The noise shaper is followed by a digital-to-analog converter whose analog output signal is applied to a low-pass filter which suppresses periodic spectra of the useful signal and which effects timeaveraging.

The last sample read appears on the output of the interpolation filter employed in DE-PS 30 31 012 and in the following noise shaper it is further processed with a higher frequency. Thus, this interpolation filter effects oversampling.

A digital circuit arrangement known from the magazine "Elektronik" No. 14 of 15.07.1983 pages 61 to 64 comprises an interpolation filter in which the samples of the input signal are read in at a rate of 44.1 kHz and read out at a rate of 176.4 kHz. This interpolation filter provides oversampling by a factor of 4 as well as low-pass filtering to suppress the periodic spectra of the useful signals. The interpolation filter is followed by a noise shaper whose output signal is applied to a digital-to-analog converter. The noise shaper comprises a first order filter.

The analog signal obtained by digital-to-analog conversion of the quantized digital signal contains quantization noise caused by said quantization. The digital signal applied to the interpolation filter and the noise shaper is further quantized in these two circuits by reduction of the word length, which gives rise to additional quantization noise. This additional quantization noise, produced in the noise shaper, is less than the quantization noise arising by quantization in a conventional quantization circuit without oversampling. The extent to which the quantization noise is reduced depends on the choice of the filter. The energy of the quantization noise is partly transferred from the signal-frequency range to a higher frequency range. The reduction of the quantization noise in the signal frequency range then depends on the filter order. The filter must be a filter which is optimized for a specific order for which the power density spectrum of the quantization noise is minimal. On the other hand, the complexity increases with the order of the filter. A second-order filter provides a satisfactory compromise between complexity and the extent to which the quantization noise of the filter is reduced.

Practical tests with second-order noise shapers have shown that for higher values of the input signal an instability of the digital circuit arrangement occurs, which impairs the desired noise shaping.

3. Object of the Invention

It is the object of the invention to construct a digital circuit arrangement of the type defined in the opening paragraph in such a way that no instability occurs.

SUMMARY OF THE INVENTION

According to the invention this object is achieved in that a limiter is arranged before the second input of the adder stage.

In the digital circuit arrangement in accordance with the invention a limiter is arranged before the second input of the adder stage, so that the arrangement also remains stable for input-signal values near the lower and upper quantization maxima. Limitation is not applied until the sum of the output signal of the adder stage and half a quantization step is larger than the maximum output signal of the quantizer. A quantization step is the interval between two possible output values of the quantizer. This limitation is not necessarily applied exactly when said sum is larger than the maximum output signal of the quantizer. The upper and the lower threshold value of the limiter must be such that no instability occurs for large input signals, i.e. the precise threshold values of the limiter must be determined by practical experiments.

The filter arrangement in the noise shaper may be arranged in such a way that first the difference between the output signals of the adder stage and the quantizer is formed and subsequently the quantization-error signal is applied to the filter arrangement or that the output signal of the adder stage and the output signal of the quantizer are first filtered in the filter arrangement and subsequently the difference between the filtered output signals of the super-adder stage and the quantizer is formed.

The limiter may be arranged between the output of the adder stage and the quantizer. Alternatively, the limiter may be arranged directly behind the adder stage. Further, it is possible to arrange the limiter directly before the second input of the adder stage. A fourth possibility is to arrange the limiter before the filter arrangement and to apply the quantization-error signal to the limiter. The quantization error signal may also be formed by a circuit (PROM) which assigns a specific value of the quantization error signal to a value of the output signal of the adder stage.

If the digital circuit arrangement in accordance with the invention is constructed in such a way that the limiter is arranged before the filter arrangement, it is fed by a subtractor for generating the quantization-error signal, which subtractor has its first input coupled to the output of the adder stage, its second input coupled to the output of the quantizer, and its output coupled to an input of the limiter, whose output is coupled to an input of the filter arrangement, which has its output coupled to the second input of the adder stage.

In a further embodiment of the invention the filter arrangement comprises a first register whose input is coupled to the limiter and whose output is coupled to an amplifier and to a second register, and in that the filter arrangement comprises a further subtractor whose first input is coupled to the second register, whose second input is coupled to the amplifier, and whose output is coupled to the output of the filter arrangement. The 2nd-order filter arrangement, for example, exhibits the following transfer function:

$$H(z) = 2z^{-1} - z^{-2}.$$

In this filter arrangement the power-density spectrum of the quantization noise in the signal-frequency range is minimal.

In order to simplify the construction of the digital-to-analog converter the quantizer generates a 1-bit signal which assumes a first state if the output signal of the adder stage is positive and which assumes the second state if the output signal of the adder stage is negative. After digital-to-analog conversion the analog signal is an applied to an integrator for time-averaging. If the quantizer generates a 1-bit output signal the oversampling factor must be larger than in the case of a quantizer supplying a multi-bit output signal to obtain proportionally the same power density spectrum of the quantisation noise in the signal frequency range.

In the last-mentioned embodiment the output signal of the quantizer may assume two values. The output signal of the interpolation filter may have different values between these two possible quantization values, depending on its resolution. Practical tests have demonstrated that limitation should not be applied until the difference between the output value of the interpolation filter and the output value of the quantizer is smaller than half an output value of the quantizer.

Embodiments of the invention will now be described in more detail, by way of example, with reference to the accompanying drawings. In the drawings:

DETAILED DESCRIPTION OF THE PREFERRED EMBODIMENTS

Figure 1:
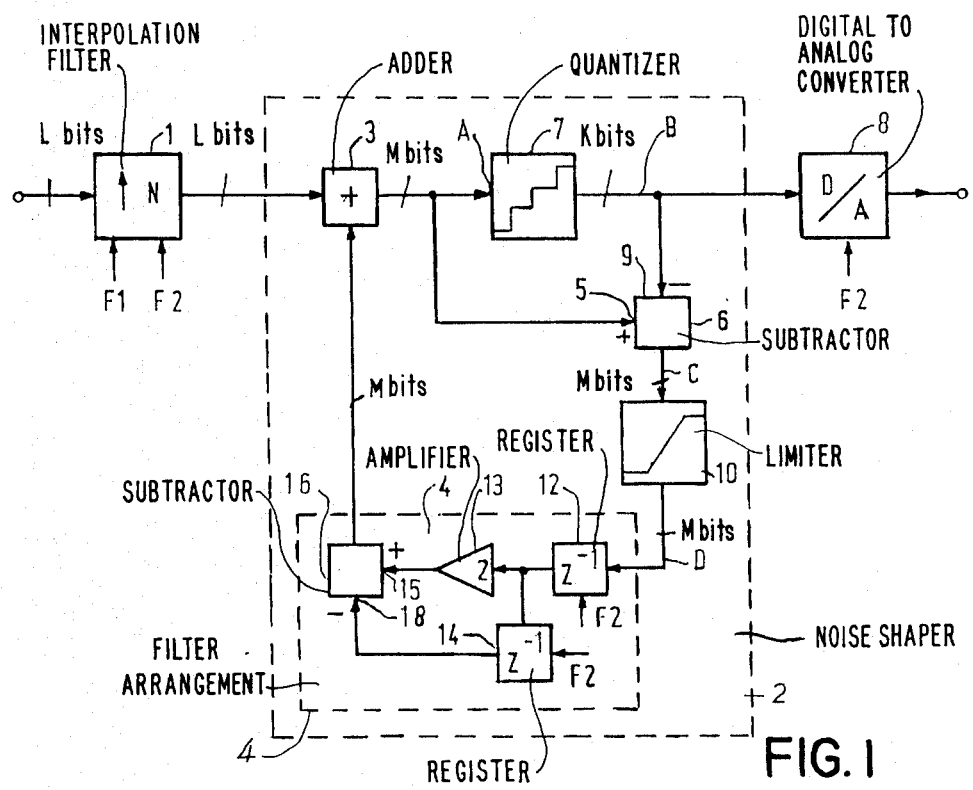
FIG. 1 shows a first embodiment of a digital circuit arrangement.

A digital input signal, which appears as a sequence of discrete-amplitude samples with a sampling rate F1 determined by a clock signal, is applied to an interpolation filter 1 in FIG. 1. The interpolation filter effects oversampling of the digital input signal, i.e. the digital output signal of the interpolation filter 1 comprises a sequence of discrete-amplitude samples which appear at a rate F2 equal to N times the sampling rate $F1 = F2/F$ of the input signal. The additional samples produced in the case of oversampling are formed by interpolation in the interpolation filter 1. The word length of the input signal and the output signal of the interpolation filter 1 is L bits.

Figure 2A:
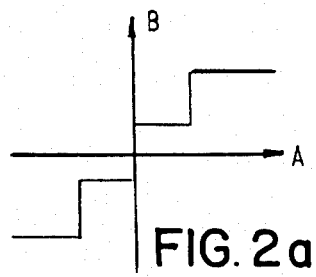
FIGS. 2a through 2d show transfer characteristics of different circuit elements of FIG. 1.

The output signal of the interpolation filter 1 is applied to a noise shaper 2. An adder stage 3 in the noise shaper 2 adds the output signal of the interpolation filter 1 to the output signal of a second-order filter arrangement 4. The word length of the digital output signal of the filter arrangement 4 is M bits, where M>L. As a result of this the output signal A of the adder stage 3 has a word length of M bits. This output signal A of the adder stage 3 is applied to a first input 5 of a subtractor 6 and to a linear quantizer 7. The quantizer 7 generates an output signal B having a word length of K bits, where K<M. A linear quantizer has the characteristic feature that its quantization steps, i.e. the interval between two successive values of the digital output signal B, and the intervals between the individual quantization steps are equal. FIG. 2a shows the transfer characteristic of a linear quantizer, which generates an output signal B having a word length of 2 bits.

Figure 2B:
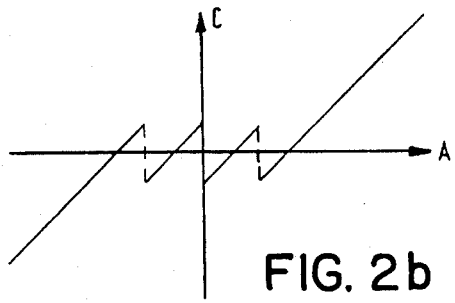

The output signal of the quantizer 7 constitutes the output signal of the noise shaper 2 and is applied to a digital-to-analog converter 8. Further, the output signal B of the quantizer 7 is applied to the second input 9 of the subtractor 6. The subtractor 6 forms an output signal C by subtracting the output signal B of the quantizer 7 from the output signal A of the adder stage 3. In the subtractor 6 the output signal B of the quantizer is combined with the output signal A of the adder stage 3 in such a way that the maximum value of the output signal B is larger than or equal to and the minimum value of said output signal is smaller than or equal to respectively the maximum and the minimum value of the output signal of the interpolation filter 1. The digital output signal C (quantization-error signal) of the subtractor 6 has a word length of M bits. FIG. 2b shows the transfer characteristic, which illustrates how the output signal C of the subtractor 6 depends upon the output signal A of the adder stage 3.

Figure 2C:
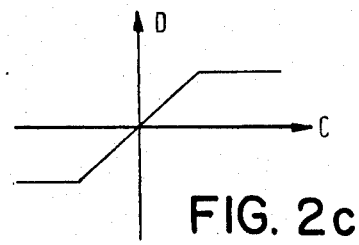
Figure 2D:
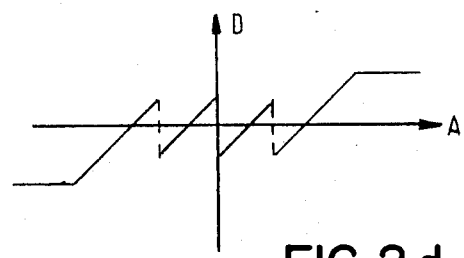

The output signal C of the subtractor 6 is applied to a limiter 10, which also forms part of the noise shaper 2. The transfer characteristic representing the dependence of the output signal D upon the input signal C of the limiter 10 is given in FIG. 2c. FIG. 2d gives the transfer characteristic representing the dependence of the output signal D of the limiter 10 upon the output signal A of the adder stage 3.

The output of the limiter 10 is connected to a register 12 in the filter arrangement 4. The output of the register 12 is connected to an amplifier 13 and to a further register 14. The output of the amplifier 13, whose gain factor is 2, is connected to a first input 15 of a subtractor 16. Moreover, the output of the register 14 is coupled to the second input 18 of the subtractor 16. The output signal of the subtractor 16, which also constitutes the output signal of the filter arrangement 4, is formed by subtracting the output signal of the register 14 from the output signal of the amplifier 13. The two registers 12 and 14 and the digital-to-analog converter B receive a clock signal of a frequency F2.

As a result of the digitization of the analog signals a discrete amplitude value rather than the instantaneous value of a signal is transmitted, which discrete amplitude value may differ from the analog value by the maximum half a quantization step. This error, which in principle cannot be suppressed, manifests itself as noise and is referred to as quantization noise. The additional quantization noise arising during word-length reduction is reduced in the noise shaper by means of the circuit arrangement shown in FIG. 1. The oversampling of the interpolation filter 1 ensures that the power-density spectrum of the further quantization noise is reduced by the ratio $F2/F1=N$ in the desired frequency range. The power-density spectrum of this quantization noise is uniformly distributed over the entire operating frequency range, because the successive errors between input value and quantized output value are uncorrelated, i.e. the quantization. noise is white noise.

In the noise shaper 2 the further quantization noise in the operating frequency range is reduced even further in that the power-density spectrum is re-arranged, i.e. the power-density spectrum in the lower frequency range is reduced and that in the higher frequency range is increased. The quantization error of the output signal B of the quantizer 7 is computed in the subtractor 6. This quantization error is superimposed on the signal of the noise shaper 2 as a correction value after operation upon by the limiter 10 and the filter, arrangement 4. By a suitable choice of the filter the power-density spectrum decreases at lower frequencies and increases at higher frequencies.

In a practical embodiment of such a digital circuit arrangement as shown in FIG. 1, it is found that without the limiter 10 an instability can occur for large input signals of the noise shaper 2, thus impairing the desired noise shaping. The lower and the upper limiter thresholds must be selected in such a way that no instability can occur. Limitation should not commence until the sum of the output signal of the adder stage and half a quantization step is larger than the maximum output signal of the quantizer 7. The exact starting point of the limiter 10 also depends on the filter 4. The limiter thresholds can therefore only be determined exactly in a practical digital circuit.

The filter arrangement 4 is a second-order transversal filter which is constructed to minimize the power-density spectrum of the quantization noise in the operating frequency range.

The advantage of such a circuit arrangement with oversampling and subsequent noise shaping is that a digital-to-analog converter with a smaller number of bits can be employed.

Figure 3:
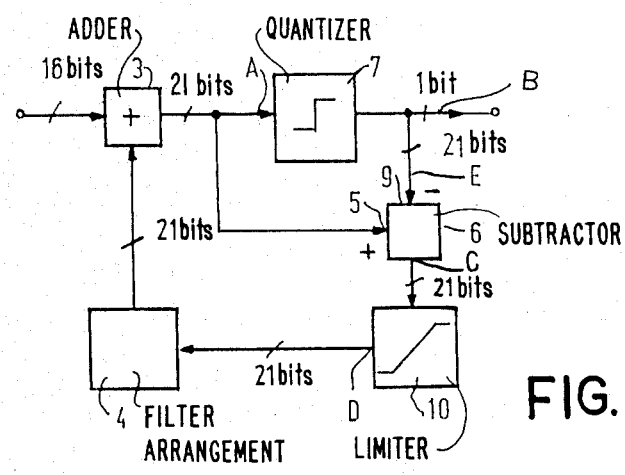
FIG. 3 shows a simplified example of the noise shaper used in FIG. 2, and FIGS. 4a through 4d show transfer characteristics of the different circuit elements in FIG. 3.
Figure 4A:
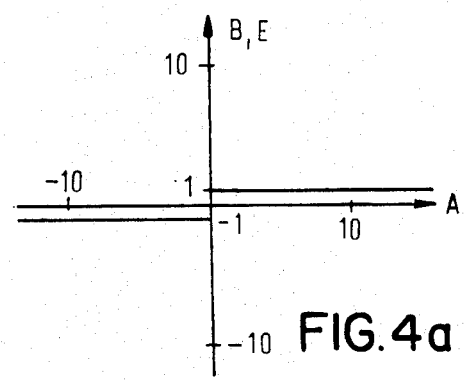
Figure 4B:
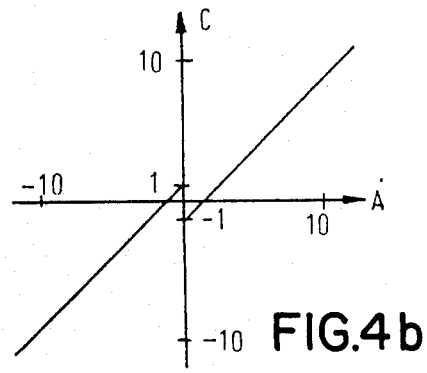
Figure 4C:
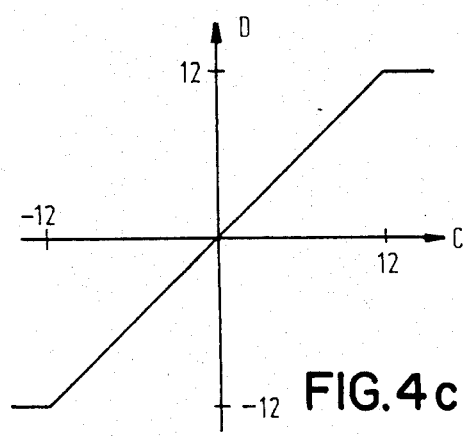
Figure 4D:
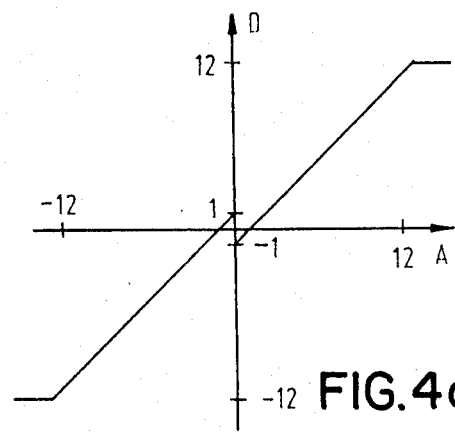

FIG. 3 shows a simplified embodiment of the noise shaper 2. In the adder stage 3 the output signal of the interpolation filter 1, which signal has been subjected to 256-fold oversampling and has a word length of 16 bits, is added to the output signal of the filter arrangement 4, which signal has a word length of 21 bits. (The leastsignificant bit of the output signal of the filter arrangement 4 and the least significant bit of the output signal of the interpolation filter 1 have the same significance). The output signal A of the adder stage 3, which signal has a word length of 21 bits, is applied to the quantizer 7 and to the subtractor 6. The quantizer 7 supplies an output signal 8 with two possible values. The output signal B assumes a first state if the output signal of the adder stage 3 is positive and a second state if the output signal of the adder stage is negative. The output signal B, which is applied to the digital-to-analog converter 8, which is not shown in FIG. 3, has a word length of 1 bit, while the output signal E of the quantizer 7, which is applied to the subtractor 6, has a word length of 21 bits. The transfer characteristic of the quantizer 7 is shown in FIG. 4a. The maximum signal value occurring in the noise shaper 2 is 16 and the minimum value is $-16$. The output signals B and E assume the value $+1$ in the case of a positive digital signal A and the value $-1$ in the case of a negative digital signal A. In the subtractor 6 the output signal E of the quantizer 7 is subtracted from the output signal A of the adder stage 3. The difference signal C on the output of the subtractor 6 is applied to the limiter 10. FIG. 4b shows the transfer characteristic which represents the dependence of the difference signal C on the output signal A of the adder stage 3. The transfer characteristic of the limiter 10 is given in FIG. 4c. In the present embodiment of the noise shaper 2 the upper threshold value of the limiter is $+12$ and the lower threshold value is $-12$. FIG. 4d shows the transfer characteristic representing the output signal D of the limiter 10 in dependence upon the output signal A of the adder stage 3. The output of the limiter 10 is connected to the filter arrangement 4.

The output signal B of the quantizer 7 is applied to the digital-to-analog converter 8, which is not shown in more detail and which converts the 1-bit signal into an analog signal which is applied to an integrator, not shown, which produces an analog signal corresponding to the time-average of the output signal of the digital-to-analog converter.

What is claimed is:

1. A digital circuit arrangement comprising an interpolation filter (1) for oversampling a digital input signal which appears as a sequence of discrete-amplitude samples with a specific sampling rate, and a noise shaper (2) comprising a quantizer, means responsive to the input and output of said quantizer for performing a quantization-error signal, an adder stage (3) whose output is coupled to the input of said quantizer (7), having a first input coupled to the output of said interpolation filter (1) and a second input, and a limiter (10) in cascade with each other coupled between the output of said quantization-error signal forming means and said second input of the adder stage for limiting and filtering the quantization-error signal.

2. A digital circuit arrangement as claimed in claim 1, characterized in that the arrangement comprises a subtractor (6) for generating the quantization-error signal, which subtractor has its first input coupled to the output of the adder stage (3), its second input coupled to the output of the quantizer (7), and its output coupled to an input of the limiter (10), whose output is coupled to an input of the filter arrangement (4), which has its output coupled to the second input of the adder stage (3).

3. A digital circuit arrangement as claimed in claim 2, characterized in that the filter arrangement (4) comprises a first register (12) whose input is coupled to the limiter (10) and whose output is coupled to an amplifier (13) and to a second register (14), and in that the filter arrangement (4) comprises a further subtractor (16) whose first input is coupled to the second register (14), whose second input is coupled to the amplifier (13) and whose output is coupled to the output of the filter arrangement (4).

4. A digital circuit arrangement as claimed in any one of the preceding claims, characterized in that the quantizer (7) comprises means for generating at its output a 1-bit signal which assumes a first state if the output signal of the adder stage (3) is positive and which assumes a second state if the output signal of the adder stage (3) is negative.

5. A quantization noise reducing circuit responsive to an input digital signal representing a temporal sequence of discrete samples, for producing an output signal therefrom, said apparatus comprising:
   an interpolation filter for oversampling said input digital signal;
   a port for said output signal;

a noise shaper interposed between the output of the interpolation filter and said port comprising:

a quantizer having an output coupled to said port;

a first signal path coupling the output of said interpolation filter to the input of said quantizer;

means responsive to the input and output of said quantizer for forming a quantization-error signal;

a second signal path including means for sequentially operating on said quantization-error signal and coupling the result of said sequentially operation to the input of said quantizer, said means for sequentially operating on said quantization-error signal comprising a filter arrangement and a limiter.

6. The circuit of claim 5 wherein said limiter feeds said filter arrangement.

7. The circuit of claim 5 wherein said filter arrangement comprises a second-order filter.

8. The circuit of claim 5 wherein said filter arrangement comprises a first register fed by the output of said limiter, a second register fed by the output of said first register and means arithmetically combining the outputs of said first and second registers.

9. The circuit of claim 5 wherein the output from said noise shaper has a digital word length less than the digital word length at the output of the filter arrangement.

10. The circuit of claim 5 further comprising an analog to digital converter fed by the output of said quantizer and feeding said output port.

11. The circuit of claim 9 wherein the output from said noise shaper has a digital word length of only one bit.

12. The circuit of claim 9 wherein the input digital signal is of a digital word length less than the digital word length at the output of said filter arrangement.

* * * * *